US009036416B2

(12) United States Patent
Mokhlesi et al.

(10) Patent No.: US 9,036,416 B2
(45) Date of Patent: May 19, 2015

(54) NON-VOLATILE STORAGE WITH BROKEN WORD LINE SCREEN AND DATA RECOVERY

(71) Applicant: SANDISK TECHNOLOGIES INC., Plano, TX (US)

(72) Inventors: Nima Mokhlesi, Los Gatos, CA (US); Lanlan Gu, San Jose, CA (US); Ashish Pal Singh Ghai, Santa Clara, CA (US); Deepak Raghu, Milpitas, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 265 days.

(21) Appl. No.: 13/675,239

(22) Filed: Nov. 13, 2012

(65) Prior Publication Data

US 2013/0128665 A1   May 23, 2013

Related U.S. Application Data

(60) Provisional application No. 61/561,289, filed on Nov. 18, 2011.

(51) Int. Cl.
| | |
|---|---|
| *G11C 16/04* | (2006.01) |
| *G11C 29/04* | (2006.01) |
| *G06F 11/10* | (2006.01) |
| *G11C 11/56* | (2006.01) |
| *G11C 16/34* | (2006.01) |
| *G11C 29/02* | (2006.01) |
| *G11C 29/50* | (2006.01) |
| *G11C 29/52* | (2006.01) |
| *G11C 16/00* | (2006.01) |

(52) U.S. Cl.
CPC .............. *G11C 16/04* (2013.01); *G11C 29/04* (2013.01); *G06F 11/1072* (2013.01); *G11C 11/5642* (2013.01); *G11C 16/00* (2013.01); *G11C 16/3404* (2013.01); *G11C 16/349* (2013.01); *G11C 29/025* (2013.01); *G11C 29/50016* (2013.01); *G11C 29/52* (2013.01); *G11C 2029/0409* (2013.01); *G11C 2029/0411* (2013.01)

(58) Field of Classification Search
CPC ............................... G11C 29/82; G11C 16/04
USPC .................. 365/185.09, 185.22, 201, 221
See application file for complete search history.

(56) References Cited

U.S. PATENT DOCUMENTS

| | | | |
|---|---|---|---|
| 6,839,285 | B2 | 1/2005 | Zink |
| 6,859,393 | B1 | 2/2005 | Yang |
| 7,301,810 | B2 | 11/2007 | Chen |
| 7,525,842 | B2 | 4/2009 | Nguyen |

(Continued)

OTHER PUBLICATIONS

International Search Report dated Feb. 14, 2013, PCT Patent Application No. PCT/US2012/064838.

(Continued)

*Primary Examiner* — Son Dinh
(74) *Attorney, Agent, or Firm* — Vierra Magen Marcus LLP

(57) ABSTRACT

Data, normally read using a page-by page read process, can be recovered from memory cells connected to a broken word line by performing a sequential read process. To determine whether a word line is broken, both a page-by page read process and a sequential read process are performed. The results of both read processes are compared. If the number of mismatches between the two read processes is greater than a threshold, it is concluded that there is a broken word line.

25 Claims, 14 Drawing Sheets

(56) References Cited

U.S. PATENT DOCUMENTS

| | | |
|---|---|---|
| 7,573,738 B2 | 8/2009 | Roohparvar |
| 7,616,500 B2 | 11/2009 | Mokhlesi |
| 7,808,819 B2 | 10/2010 | Murin |
| 7,870,457 B2 * | 1/2011 | Mokhlesi .................. 714/752 |
| 7,916,552 B2 | 3/2011 | Guterman |
| 8,130,544 B2 | 3/2012 | Chon |
| 8,151,035 B2 | 4/2012 | Smith |
| 8,174,892 B2 | 5/2012 | Nguyen |
| 2003/0145151 A1 | 7/2003 | Matsushita |
| 2010/0064200 A1 | 3/2010 | Choi |

OTHER PUBLICATIONS

Written Opinion of the International Searching Authority dated Feb. 14, 2013, PCT Patent Application No. PCT/US2012/064838.

Response to Office Action dated Jan, 21, 2015, European Patent Application No. 12805813.8.

* cited by examiner

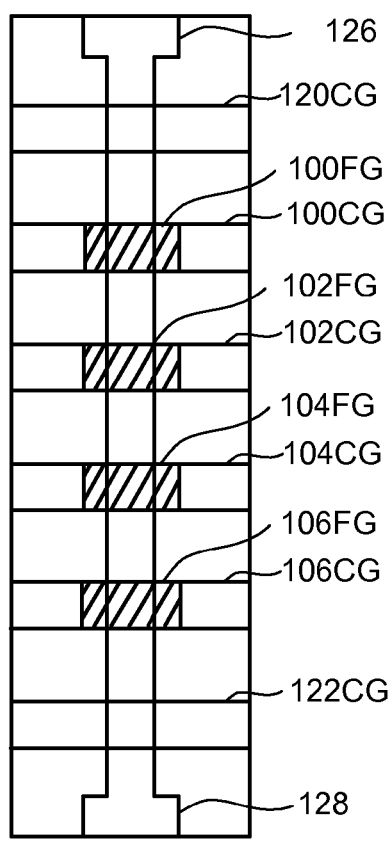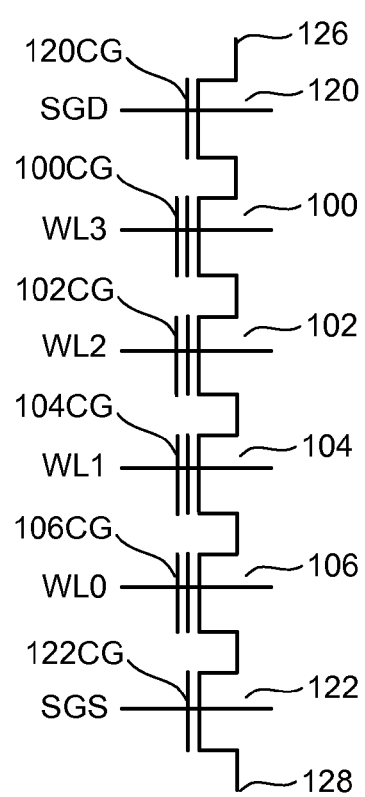

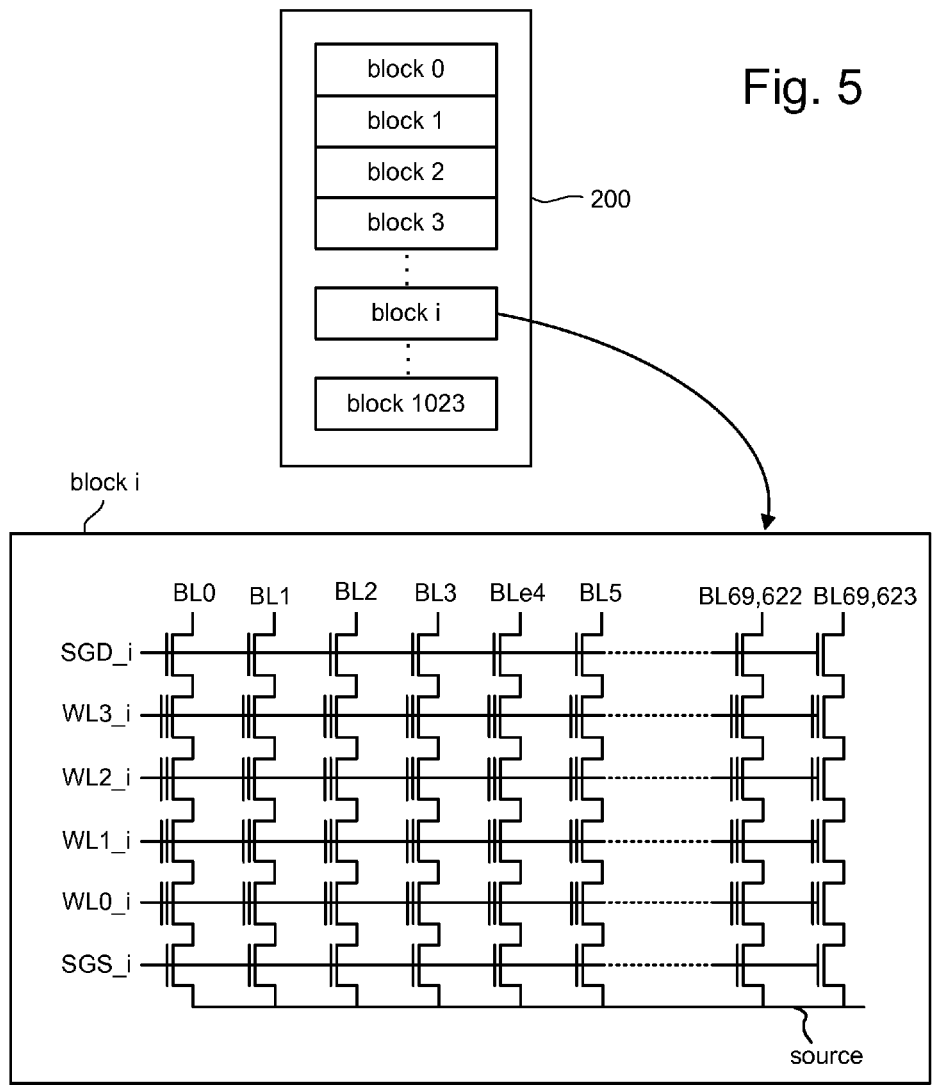
Fig. 5
Fig. 6
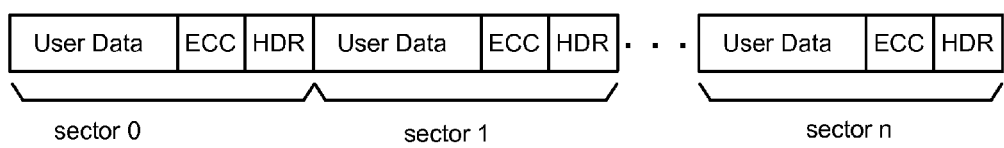

| Page/State | S0 | S1 | S2 | S3 | S4 | S5 | S6 | S7 |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

NON-VOLATILE STORAGE WITH BROKEN WORD LINE SCREEN AND DATA RECOVERY

This application claims priority from U.S. Provisional Application 61/561,289, filed on Nov. 18, 2011, incorporated herein by reference in its entirety.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

In some embodiments, the program voltage applied to the control gate includes a series of pulses that are increased in magnitude with each successive pulse by a predetermined step size (e.g. 0.2 v, 0.3 v, 0.4 v, or others). Between pulses, the memory system will verify whether the individual memory cells have reached their respective target threshold voltage ranges. Those memory cells that have reached their target threshold voltage range will be locked out of future programming (e.g., by raising the bit line voltage to Vdd). When all memory cells have reached their target threshold voltage range, programming is complete.

Like other integrated circuits, semiconductor memory devices can suffer from manufacturing defects. As part of the manufacturing phase, memory devices are tested for defects. In some cases, word lines can be manufactured with a defect that does not cause the memory device to fail the testing during the manufacturing phase. However, after use the defective word line can cause an error.

BRIEF DESCRIPTION OF THE DRAWINGS

FIG. 1 is a top view of a NAND string.

FIG. 2 is an equivalent circuit diagram of the NAND string.

FIG. 5 is a block diagram depicting one embodiment of a memory array.

FIG. 6 depicts a page of data.

DETAILED DESCRIPTION

Figure 3:
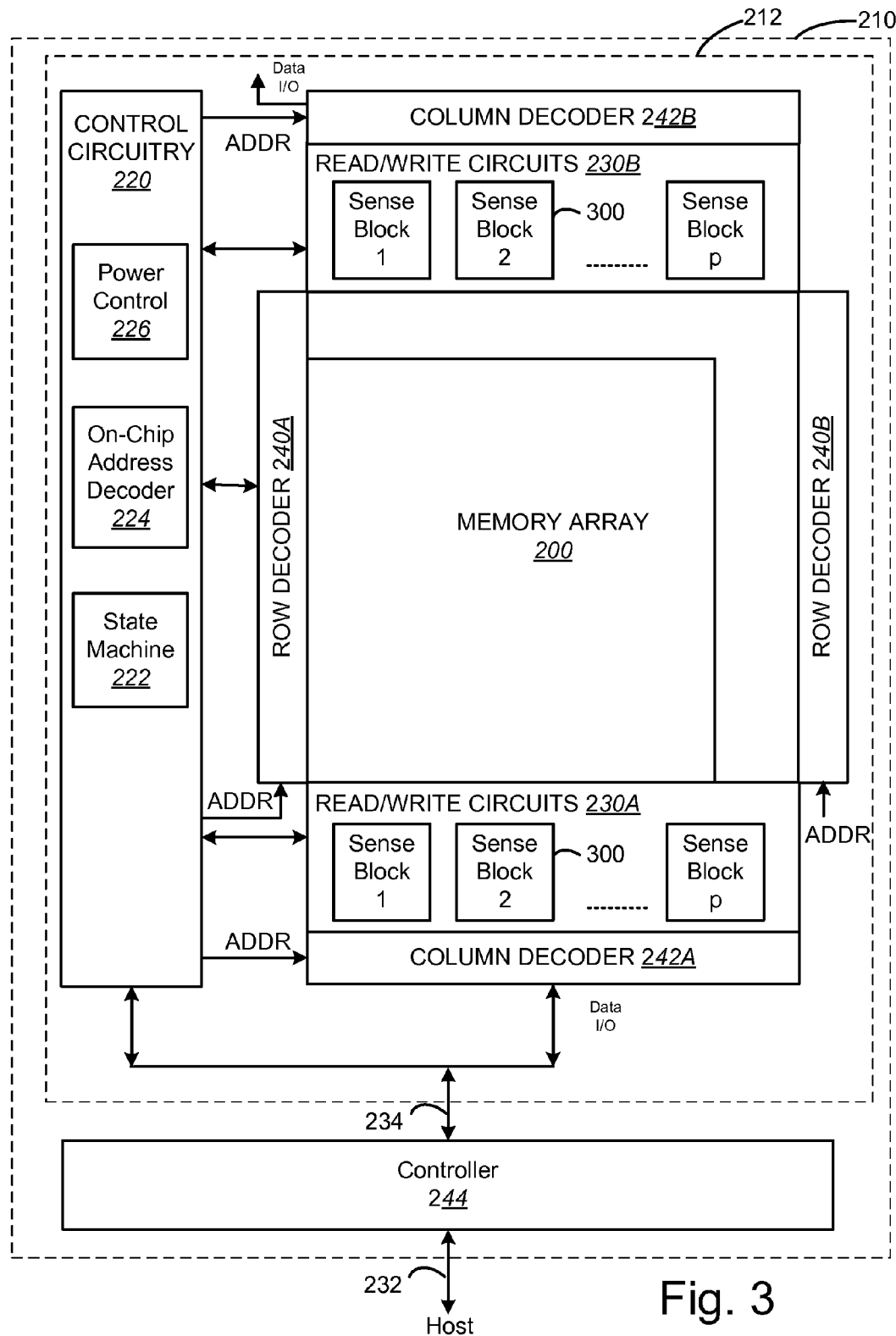
FIG. 3 is a block diagram of a non-volatile memory system.

To determine whether a word line of a non-volatile storage system is broken, both a page-by page read process and a sequential read process are performed. The results of both read processes are compared. If the number of mismatches from the two read processes is greater than a threshold, it is concluded that there is a broken word line.

Data, normally read using a page-by page read process, can be recovered from memory cells connected to a broken word line by performing a sequential read process.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
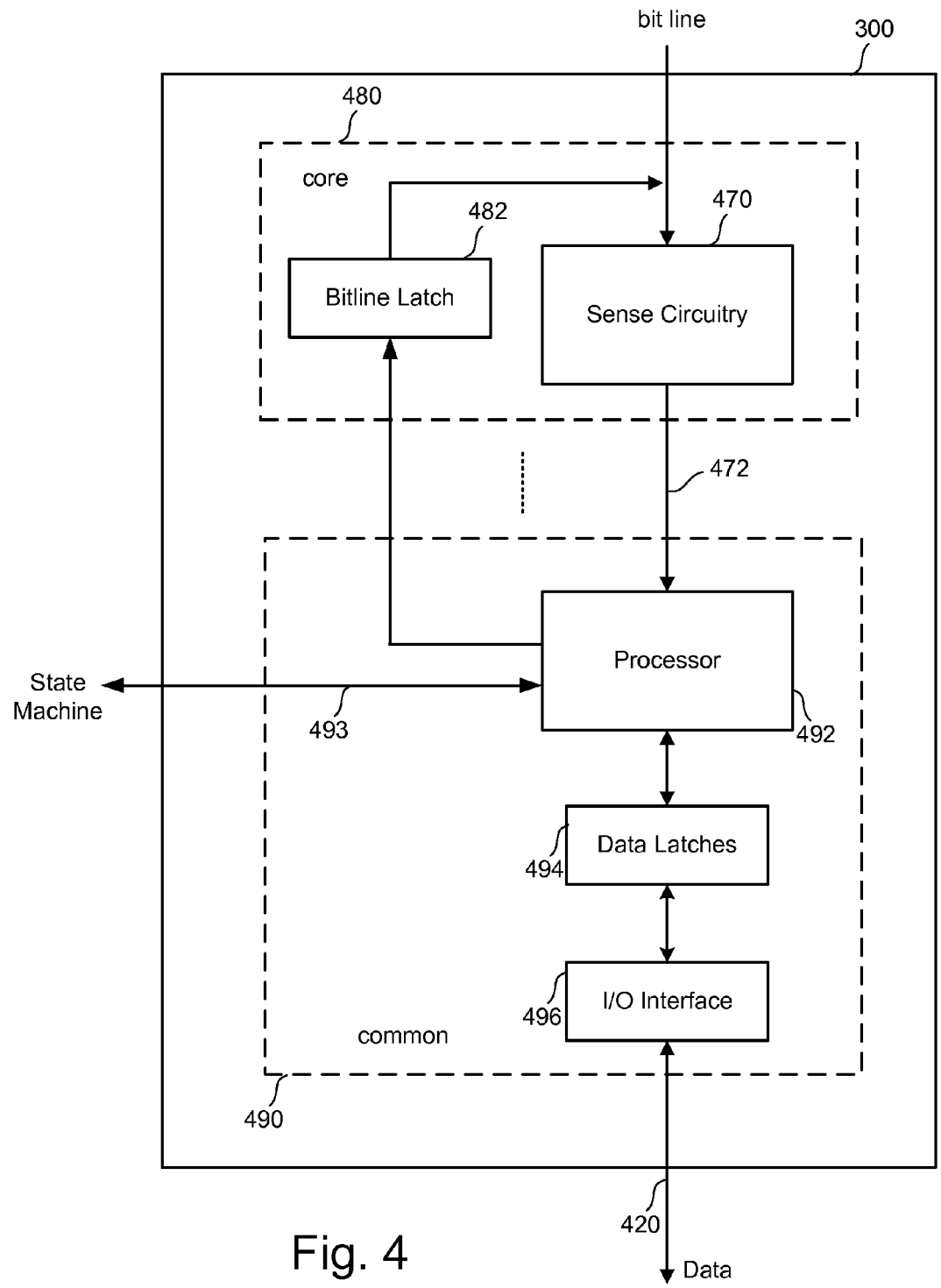
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in come embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, . . . , BL69,623. In one embodiment, all the bit lines of a block can be simultaneously selected during read and program operations. Memory cells along a common word line and connected to any bit line can be programmed (or read) at the same time. In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

FIG. 6 depicts data for a page. Depending on the size of the page, the page contains many sectors. Each sector includes User Data, error correction codes (ECC), and header information (HDR).

In some memory systems utilizing multi-state memory cells, each bit of data in a memory cell is in a different page. For example, if an array of memory cells store three bits of data (eight states or levels of data) per memory cell, each memory cell stores data in three pages with each of the three bits being on a different page. Thus, within a block in this example, each word line is associated with three pages or an integer multiple of three pages. Other arrangements are also possible.

The use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" (or original data) data bits being encoded. For example, the storage of error correction coded data in a memory resource involves the encoding of one or more code words to include the actual data and the additional code bits, using a selected code. Retrieval of the stored data involves the decoding of the stored code words according to the same code as used to encode the stored code words. Because the code bits "over-specify" the actual data portion of the code words, some number of error bits can be tolerated, without any loss of actual data evident after decoding.

Many ECC coding schemes are well known in the art. These conventional error correction codes are especially useful in large scale memories, including flash (and other non-volatile) memories, because of the substantial impact on manufacturing yield and device reliability that such coding schemes can provide, allowing devices that have a few non-programmable or defective cells to be useable. Of course, a tradeoff exists between the yield savings and the cost of providing additional memory cells to store the code bits (i.e., the code "rate"). Some ECC codes for flash memory devices tend to have higher code rates (i.e., a lower ratio of code bits to data bits) than the codes used in data communications applications (which may have code rates as low as ½).

Some memory cells are slower to program or erase than others because of manufacturing variations among those cells, because those cells were previously erased to a lower threshold voltage than others, because of uneven wear among the cells within a page, or other reasons. And, of course, some cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementations, programming and erasing time is saved by terminating the sequence of programming or erasing pulses when the number of error memory cells that are not yet fully programmed or erased is fewer than the number of bits that are correctable.

Error correction is typically performed on a sector-by-sector basis. Thus, each sector will have its own set of ECC codes. This error correction is convenient and useful because, in one embodiment, the sector is the desired unit of data transfer to and from the host system.

Figure 7:
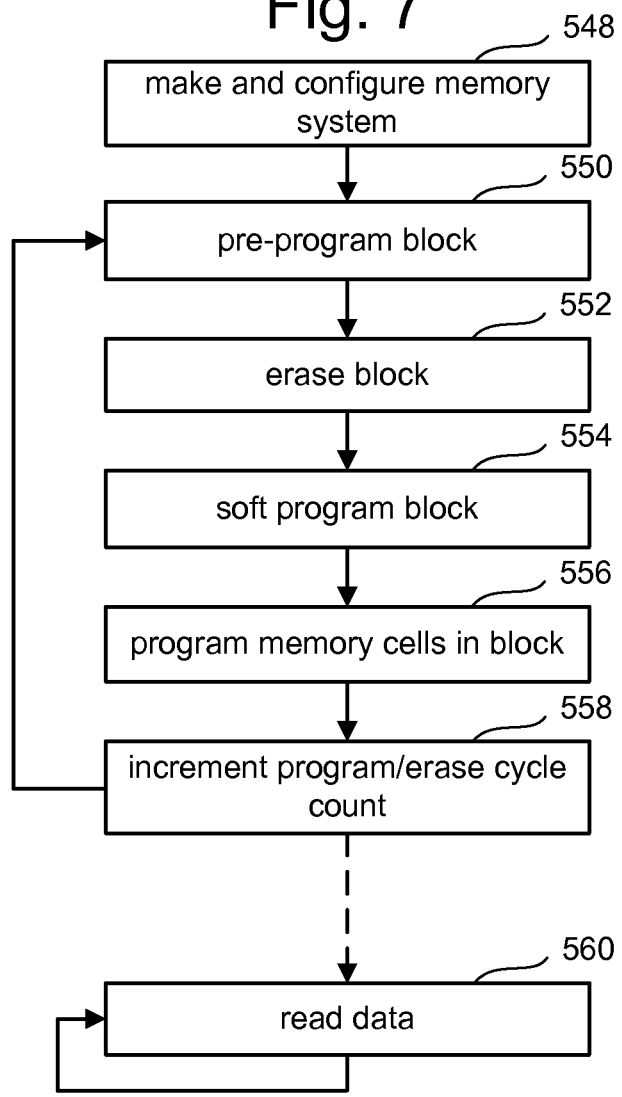
FIG. 7 is a flow chart describing one embodiment of a process for making and using a non-volatile storage system.

FIG. 7 is a flow chart describing a process for making and operating a non-volatile storage system. In step 548, the non-volatile storage system is manufactured and configured for use. More details of step 548 are provided below. Once the non-volatile storage system is manufactured and configured, it may be used to program and read data. Step 550 is optionally performed as part of a process to program data. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution.

In step 556, the memory cells of the block are programmed. The programming can be performed in response to a request to program from the host, or in response to an internal process. In step 558, the program/erase cycle count is incremented. The non-volatile storage system will maintain a count of program/erase cycles in a register, flash memory or other location. After each program/erase cycle the program/erase cycle count is incremented.

After programming, the memory cells of the block can be read (step 560). Many different read processes known in the art can be used to read data. In some embodiments, the read process includes using ECC to correct errors. The data that is read is output to the hosts that requested the read operation. The ECC process can be performed by the state machine, the controller or another device.

FIG. 7 shows that the erase-program cycle can happen many times without or independent of reading (loop consisting of steps 550-558), the read process can occur many times without or independent of programming, and the read process can happen any time after programming (represented by the dashed line between 558 and 560). The process of FIG. 7 can be performed at the direction of the state machine using the various circuits described above. In other embodiments, the process of FIG. 7 can be performed at the direction of the Controller using the various circuits described above.

Figure 8:
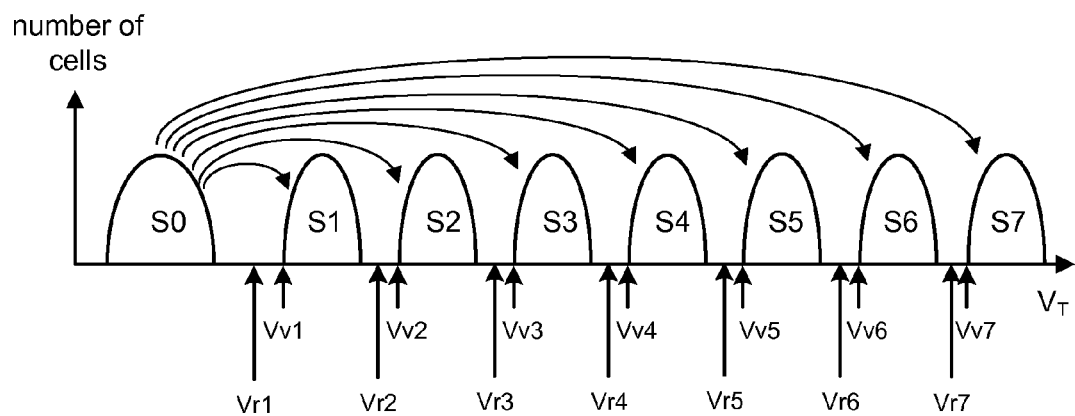
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to a different logical page. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged/charged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 9:
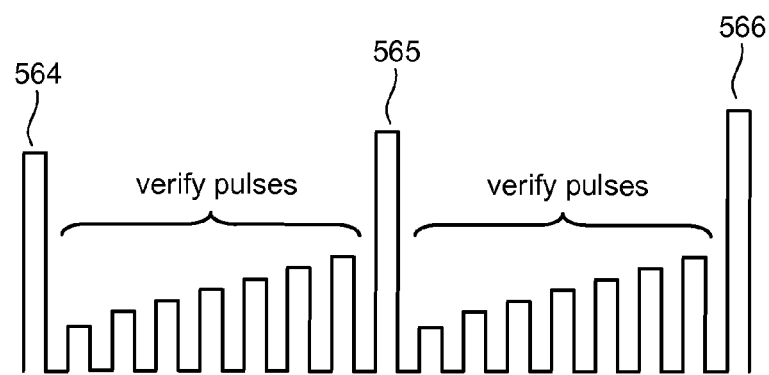
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. No. 7,301,817; U.S. Patent App. 2004/0109362; and U.S. Patent App. 2009/0147573.

Figure 10A:
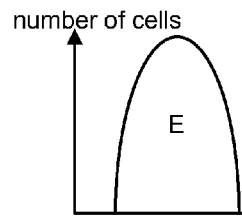
FIGS. 10A-E show various threshold voltage distributions and describe a process for programming non-volatile memory.
Figure 10B:
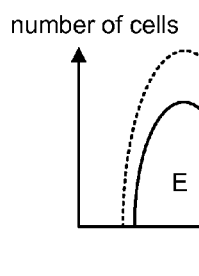

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. The memory cells targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
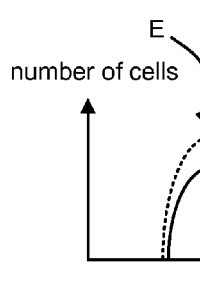
Figure 10D:
Figure 10E:

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

In some programming processes, coarse/fine programming techniques can be incorporated. For example, memory cells being programmed to a target condition (e.g., Vv2) would first be quickly programmed to a coarse condition (e.g., Vv2 less a small voltage) that corresponds to a threshold voltage condition slightly lower than the target condition. Subsequently, the memory cells would be programmed to the target condition in a manner more slowly (and with more precision). The coarse/fine programming techniques can be used for programming to all or a subset of the data states.

Figure 11:
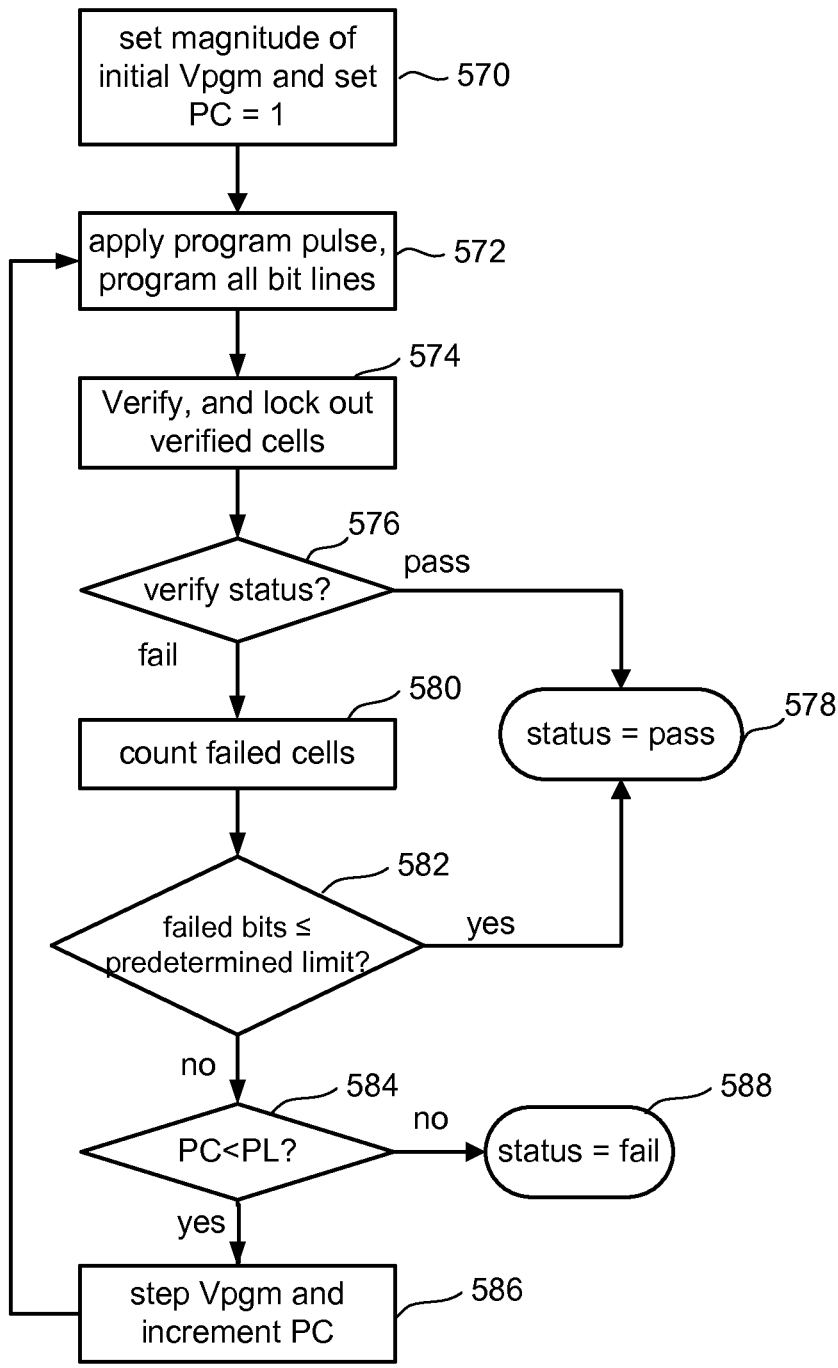
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed are all connected to the same word line (the selected word line). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the appropriate verify compare voltage (Vv1, Vv2, Vv3, Vv4, Vv5, Vv6, and Vv7) to the selected word line and the read pass voltage to unselected word lines.

In step 576, it is determined whether all the memory cells have reached their target threshold voltages. If so, the programming process is complete and successful because all selected memory cells were programmed and verified to their target states. A status of "PASS" is reported in step 578. If, in 576, it is determined that not all of the memory cells have reached their target threshold voltages, then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed cells is not less than the predetermined limit, than the programming process continues at step 584 and the program counter PC is checked against the program limit value (PL). One example of a program limit value is 20; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figures 12, 14:
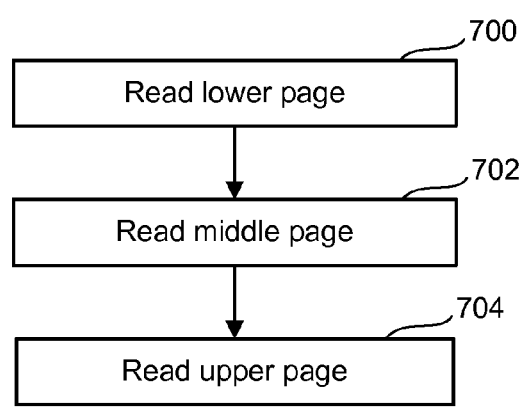
FIG. 12 depicts one example of a data encoding scheme. Other data encoding schemes can also be used.
FIG. 14 is a flow chart describing one embodiment of a page-by-page read process.

FIG. 12 is a table that shows one example of a data encoding scheme, and identifies the data in each of the upper, middle and lower pages for each data state S0-S7.

Figure 13:
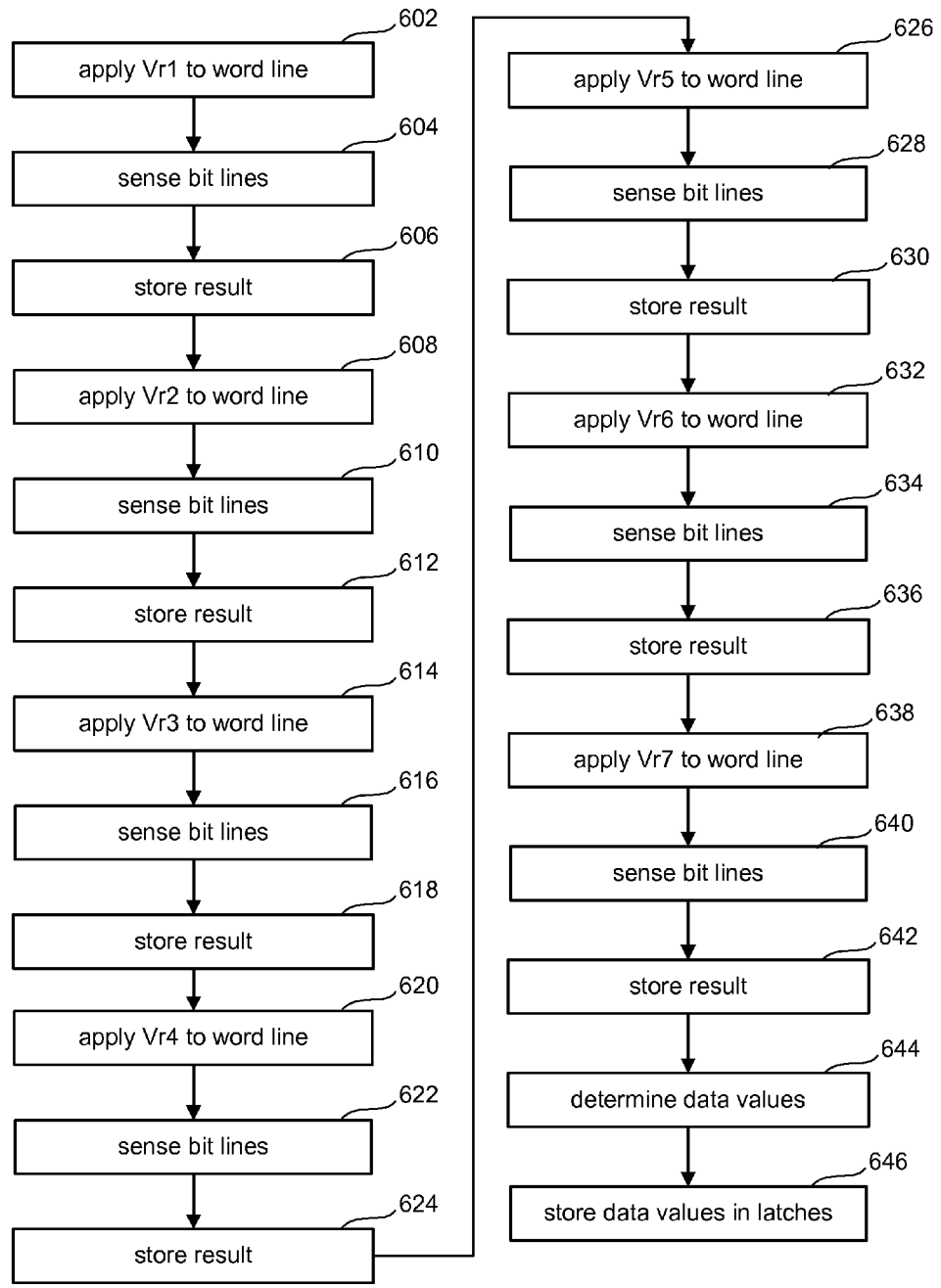
FIG. 13 is a flow chart describing one embodiment of a sequential read process.

In one embodiment, data is normally read using a page-by-page read process, which comprises reading a particular page of data at a time. In other words, data is read from the memory cells a page at a time. That is, the page is the unit of the read operation. In some embodiments, only one page of data is read at a time. So, if only one page is data is needed, then only the one page of data is read. If there are too many errors (due to a broken word line or other reason) that cannot be corrected by an error correction (or other) process, the data can be recovered from memory cells connected to a broken word line by performing a sequential read process. A sequential read process reads all of the data in all of the memory cells being read as all of the data states are tested. In some embodiments, a page-by-page read process is faster than a sequential read process, but a sequential read process is more accurate than a page-by-page read process. FIG. 13 is a flow chart describing one embodiment of a sequential read process. FIG. 14 is a flow chart describing one embodiment of a page-by-page read process.

Note that in FIG. 13, some of the steps recite "store results." Strictly speaking, in one embodiment the system does not store results of all these binary reads because it would run out of latches if it simply stored results for every read operation. Instead, in some embodiments, the system performs some logical operations that condense the data so that it do not need seven latches to store results of seven read levels. With logic operations performed on these seven reads as the system is in the middle of the process of performing the seven reads, the system condenses data on the fly so that no more than three latches are needed to store the three bits that are required for a memory cells that store three bits per memory cell. With three bits the system can store 2^3=8 states.

First the sequential read process is described. In step 602 of FIG. 13, read reference voltage Vr1 is applied to the selected word line (connected to the memory cells to be read). In step 604, the bit lines associated with the memory cells to be read are sensed to determine whether the addressed memory cells turn on or do not turn on based on the application of Vr1 to their control gates. Bit lines that conduct indicate that the memory cells were turned on; therefore, the threshold voltages of those memory cells are below Vr1 (e.g., in state S0). In step 606 the result of the sensing for the bit lines is stored in the appropriate latches for those bit lines.

In step 608 of FIG. 13, read reference voltage Vr2 is applied to the selected word line (connected to the memory cells to be read). In step 610, the bit lines associated with the memory cells to be read are sensed to determine whether the addressed memory cells turn on or do not turn on based on the application of Vr2 to their control gates. Bit lines that conduct indicate that the memory cells were turned on; therefore, the threshold voltages of those memory cells are below Vr2 (e.g., in states S0 or S1). In step 612 the result of the sensing for the bit lines is stored in the appropriate latches for those bit lines.

In step 614 of FIG. 13, read reference voltage Vr3 is applied to the selected word line (connected to the memory cells to be read). In step 616, the bit lines associated with the memory cells to be read are sensed to determine whether the addressed memory cells turn on or do not turn on based on the application of Vr3 to their control gates. Bit lines that conduct indicate that the memory cells were turned on; therefore, the threshold voltages of those memory cells are below Vr3 (e.g., in states S0, S1, or S2). In step 618 the result of the sensing for the bit lines is stored in the appropriate latches for those bit lines. This storing of results can take the form of modifying the two bits in the two latches that hold the results of the previous two reads at Vr1 and Vr2, in order to conserve latches. The first three read operations partition the cells into 4 categories, and only 2 bits are needed to store the information about each cell being in one of these 4 categories.

In step 620 of FIG. 13, read reference voltage Vr4 is applied to the selected word line (connected to the memory cells to be read). In step 622, the bit lines associated with the memory cells to be read are sensed to determine whether the addressed memory cells turn on or do not turn on based on the application of Vr4 to their control gates. Bit lines that conduct indicate that the memory cells were turned on; therefore, the threshold voltages of those memory cells are below Vr4 (e.g., in states S0, S1, S2 or S3). In step 624 the result of the sensing for the bit lines is stored in the appropriate latches for those bit lines.

In step 626 of FIG. 13, read reference voltage Vr5 is applied to the selected word line (connected to the memory cells to be read). In step 628, the bit lines associated with the memory cells to be read are sensed to determine whether the addressed memory cells turn on or do not turn on based on the application of Vr5 to their control gates. Bit lines that conduct indicate that the memory cells turned on; therefore, the threshold voltages of those memory cells are below Vr5 (e.g., in states S0, S1, S2, S3 or S4). In step 630 the result of the sensing for the bit lines is stored in the appropriate latches for those bit lines.

In step 632 of FIG. 13, read reference voltage Vr6 is applied to the selected word line (connected to the memory cells to be read). In step 634, the bit lines associated with the memory cells to be read are sensed to determine whether the addressed memory cells turn on or do not turn on based on the application of Vr6 to their control gates. Bit lines that conduct indicate that the memory cells turned on; therefore, the threshold voltages of those memory cells are below Vr6 (e.g., in states S0, S1, S2, S3, S4 or S5). In step 636 the result of the sensing for the bit lines is stored in the appropriate latches for those bit lines.

In step 638 of FIG. 13, read reference voltage Vr7 is applied to the selected word line (connected to the memory cells to be read). In step 640, the bit lines associated with the memory cells to be read are sensed to determine whether the addressed memory cells turn on or do not turn on based on the application of Vr7 to their control gates. Bit lines that conduct indicate that the memory cells were turned on; therefore, the threshold voltages of those memory cells are below Vr7 (e.g., in states S0, S1, S2, S3, S4, S5 or S6). If the memory cells do not turn on, they are in state S7. In step 642 the result of the sensing for the bit lines is stored in the appropriate latches for those bit lines.

In step 644, the data values for each bit line are determined. For example, if a memory cell conducts at Vr1, then the memory cell is in state S0. If a memory cell conducts at Vr2 and Vr3 but not at Vr1, then the memory cell is in state S1. And so on. In step 646, processor 392 will store the determined data values in the appropriate latches for each bit line. In other embodiments, sensing the various levels may occur in different orders.

FIG. 14 is a flow chart describing one embodiment of a page-by-page read process. In step 700, data for the lower page is read. In step 702, data for the middle page is read. In step 704, data for the upper page is read. Subsequently, the data read is stored and reported to the controller and host. The page-by-page read process can include performing all three of steps 700-704, two of steps 700-704 or just one of steps 700-704.

Figure 15:
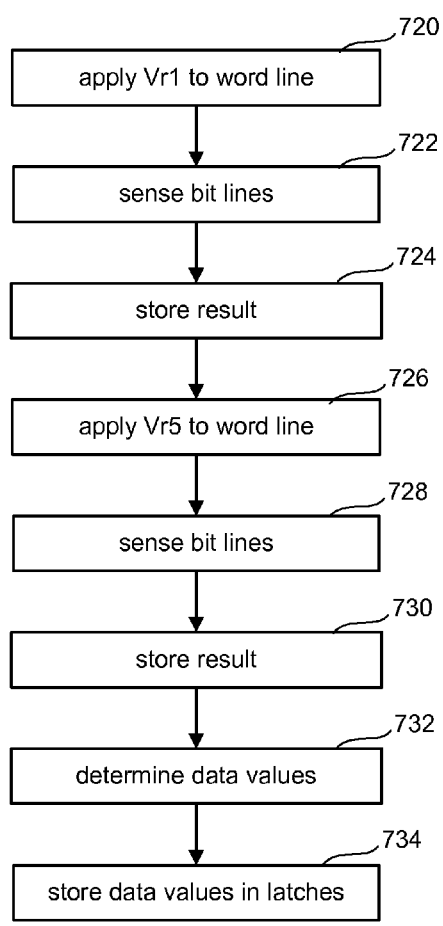
FIG. 15 is a flow chart describing one embodiment of a method for reading the lower page, which can be all or part of a page-by-page read process.

FIG. 15 is a flow chart describing one embodiment of a method for reading the lower page, which can be all or part of a page-by-page read process. The process of FIG. 15 is one example implementation of step 700 of FIG. 14.

In step 720 of FIG. 15, read reference voltage Vr1 is applied to the selected word line (connected to the memory cells to be read). In step 722, the bit lines associated with the memory cells to be read are sensed to determine whether the addressed memory cells turn on or do not turn on based on the application of Vr1 to their control gates. Bit lines that conduct indicate that the memory cells turned on; therefore, the threshold voltages of those memory cells are below Vr1 (e.g., in state S0). In step 724, the result of the sensing for the bit lines is stored in the appropriate latches for those bit lines.

In step 726 of FIG. 15, read reference voltage Vr5 is applied to the selected word line (connected to the memory cells to be read). In step 728, the bit lines associated with the memory cells to be read are sensed to determine whether the addressed memory cells turn on or do not turn on based on the application of Vr5 to their control gates. In step 730 the result of the sensing for the bit lines is stored in the appropriate latches for those bit lines.

In step 732, the data values for each bit line are determined. For example, if a memory cell conducts in response to Vr1 or does not conduct in response to Vr5, then the lower page data is 1. If a memory cell does not conducts in response to Vr1 but does conduct in response to Vr5, then the lower page data is 1. In step 734, processor 392 will store the determined data values in the appropriate latches for each bit line. In other embodiments, sensing the various levels may occur in different orders.

Figure 16:
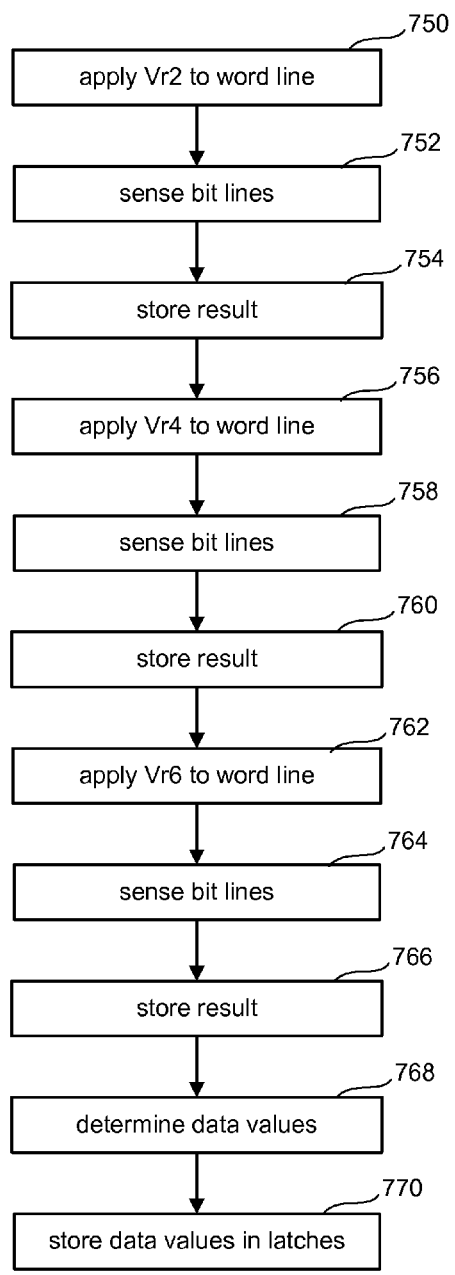
FIG. 16 is a flow chart describing one embodiment of a method for reading the middle page, which can be all or part of a page-by-page read process.

FIG. 16 is a flow chart describing one embodiment of a method for reading the middle page, which can be all or part of a page-by-page read process. The process of FIG. 16 is one example implementation of step 702 of FIG. 14.

In step 750 of FIG. 16, read reference voltage Vr2 is applied to the selected word line (connected to the memory cells to be read). In step 752, the bit lines associated with the memory cells to be read are sensed to determine whether the addressed memory cells turn on or do not turn on based on the application of Vr2 to their control gates. In step 754 the result of the sensing for the bit lines is stored in the appropriate latches for those bit lines.

In step 756 of FIG. 16, read reference voltage Vr4 is applied to the selected word line (connected to the memory cells to be read). In step 758, the bit lines associated with the memory cells to be read are sensed to determine whether the addressed memory cells turn on or do not turn on based on the application of Vr4 to their control gates. In step 760 the result of the sensing for the bit lines is stored in the appropriate latches for those bit lines.

In step 762 of FIG. 16, read reference voltage Vr6 is applied to the selected word line (connected to the memory cells to be read). In step 764, the bit lines associated with the memory cells to be read are sensed to determine whether the addressed memory cells turn on or do not turn on based on the application of Vr6 to their control gates. In step 766 the result of the sensing for the bit lines is stored in the appropriate latches for those bit lines.

In step 768, the data values for each bit line are determined. For example, the middle page data is 1 if a memory cell conducts in response to Vr2. The middle page data is also 1 if the memory cell conducts in response to Vr6 and does not conduct in response to Vr4. The middle page data is 0 is the memory cell does not conduct in response to Vr6. The middle page data is also 0 is the memory cell does not conduct in response to Vr2 and does conduct in response to Vr4. In step 770, processor 392 will store the determined data values in the appropriate latches for each bit line. In other embodiments, sensing the various levels may occur in different orders.

Figure 17:
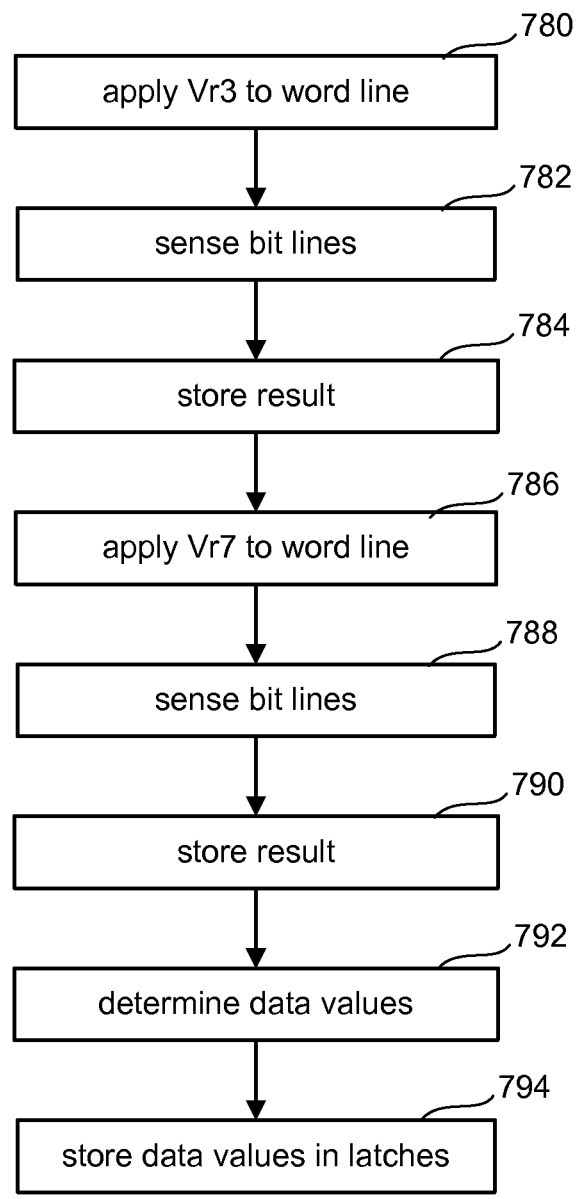
FIG. 17 is a flow chart describing one embodiment of a method for reading the upper page, which can be all or part of a page-by-page read process.

FIG. 17 is a flow chart describing one embodiment of a method for reading the upper page, which can be all or part of a page-by-page read process. The process of FIG. 17 is one example implementation of step 704 of FIG. 14.

In step 780 of FIG. 17, read reference voltage Vr3 is applied to the selected word line (connected to the memory cells to be read). In step 782, the bit lines associated with the memory cells to be read are sensed to determine whether the addressed memory cells turn on or do not turn on based on the application of Vr3 to their control gates. In step 784 the result of the sensing for the bit lines is stored in the appropriate latches for those bit lines.

In step 786 of FIG. 17, read reference voltage Vr7 is applied to the selected word line (connected to the memory cells to be read). In step 788, the bit lines associated with the memory cells to be read are sensed to determine whether the addressed memory cells turn on or do not turn on based on the application of Vr7 to their control gates. In step 790 the result of the sensing for the bit lines is stored in the appropriate latches for those bit lines.

In step 792, the data values for each bit line are determined. For example, the upper page data is 1 if a memory cell conducts in response to Vr3 or the memory cell dos not conduct in response to Vr7; otherwise, the upper page data is 0. In step 794, processor 392 will store the determined data values in the appropriate latches for each bit line. In other embodiments, sensing the various levels may occur in different orders.

Figure 18:
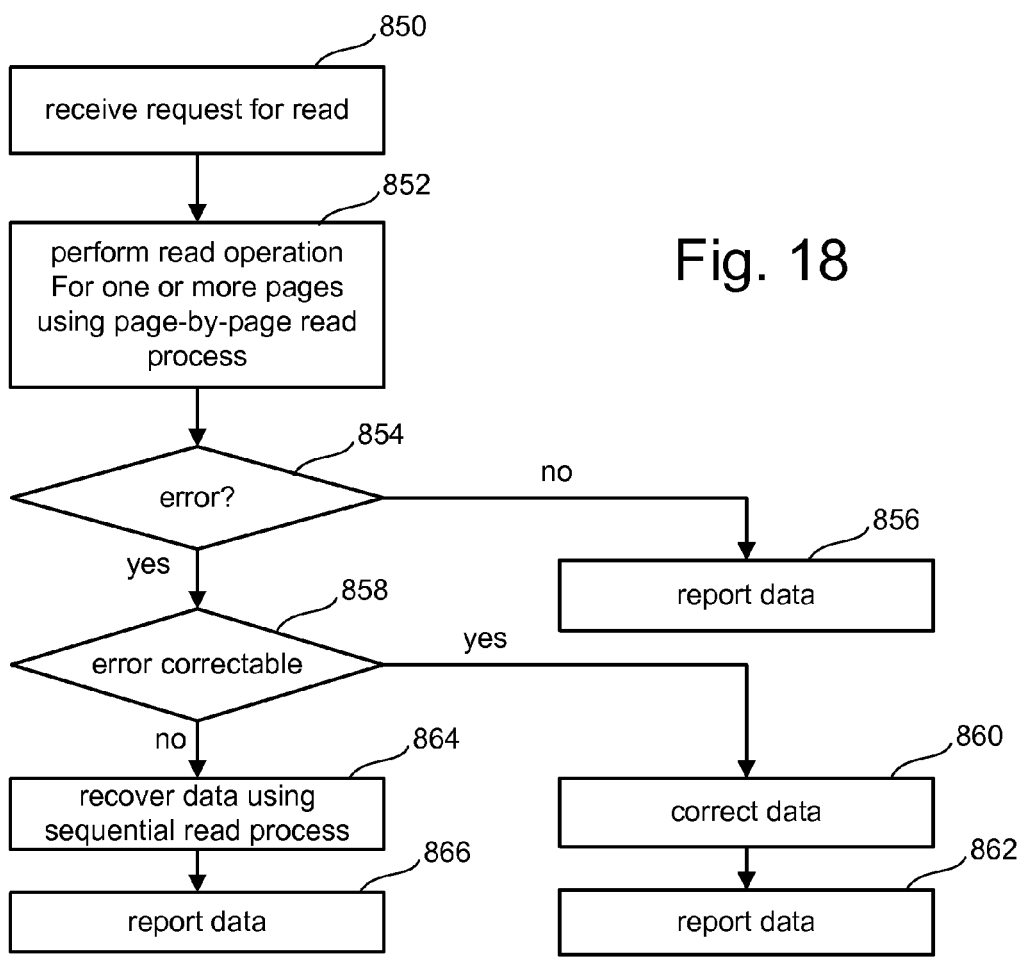
FIG. 18 is a flow chart describing one embodiment of a process for reading data.

FIG. 18 is a flow chart describing one embodiment of a process for reading data. The process of FIG. 18 can be performed as one example implementation of step 560 of FIG. 7. In step 850, a request to read data is received. In step 852, a read operation is performed for one or more pages in response to the request to read data using the page-by-page read process described above with respect to FIG. 14. In one embodiment, when data for a page is programmed, the system will also create extra bits used for Error Correction Codes (ECCs) and write those ECC bits along with the page of data. ECC technologies are well known in the art. The ECC process used can include any suitable ECC process known in the art. When reading data from a page, the ECC bits will be used to determine whether there are any errors in the data (step 854). The ECC process can be performed by the controller, the state machine or elsewhere in the system. If there are no errors in the data, the data is reported to the user at step 856. For example, data will be communicated to a controller or host via data I/O lines. If an error is found at step 854, it is determined whether the error is correctable (step 858). Various ECC methods have the ability to correct a predetermined number of errors in a set of data. If the ECC process can correct the data, then the ECC process is used to correct that data in step 860 and the data, as corrected, is reported to the user in step 862. If the data is not correctable by the ECC process, a data recovery process is performed in step 864. In one embodiment, the data recovery process of step 864 includes performing the sequential read process of FIG. 13. After the data is recovered using the sequential read process of FIG. 13, that data is reported in step 866.

In some embodiments, if the sequential read process performed in step 864 does not provide suitable results, the read compares levels (Vr1, Vr2, . . . ) can be changed using any of various methods known in the art and then the sequential read process can be repeated.

Figure 19:
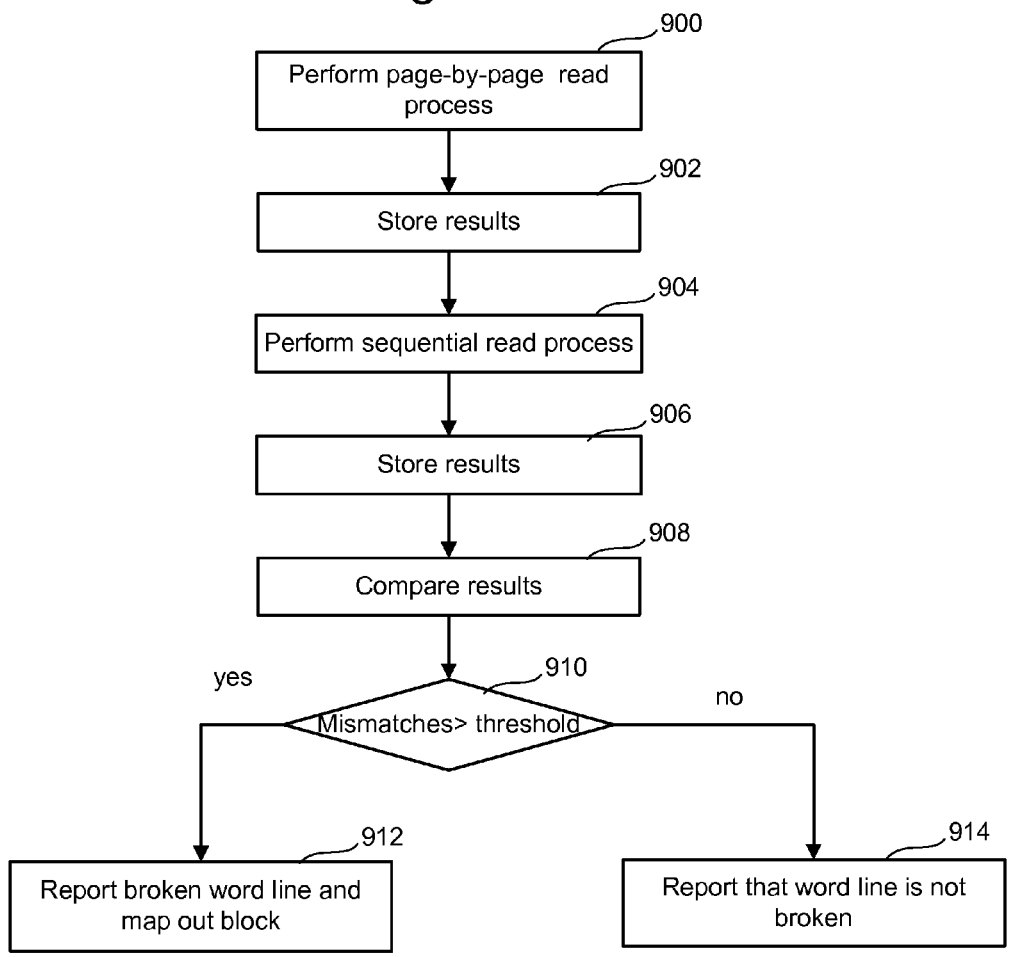
FIG. 19 is a flow chart describing one embodiment of a process for testing whether a word line is broken.

FIG. 19 is a flow chart describing one embodiment of a process for testing whether a word line is broken. The process of FIG. 19 can be performed as a test during the manufacturing stage (e.g., during die sort) or at another time (e.g., in the field after the system is in use). In step 900, all (or a subset) of the memory cells connected to a word line are read using one or more page-by-page read processes to read data for all (or a subset) of the pages for those memory cells. For example, one example embodiment of step 900 includes performing the process of FIG. 14. The results of step 900 are stored in step 902. In step 904, all (or a subset) of the memory cells connected to a word line are read using sequential read processes to read data for all (or a subset) of the pages for those memory cells. For example, one example embodiment of step 904 includes performing the process of FIG. 13. The results of step 904 are stored in step 906.

In step 908, the results of the sequential read process are compared to the results of the page-by-page read process. For example, corresponding bits can be XNOR'd by software or dedicate hardware. The number of bits that do not match (e.g., the bit from the sequential read process is different than the corresponding bit of the page-by-page read process) are counted. If the number of bits that do not match is greater than a threshold (step 910), then the system will report that the word line is broken and the block that includes that word line is mapped out of the usable blocks in step 912. If the number of bits that do not match is not greater than a threshold (step 910), then the system will report that the word line is not broken (step 914). One example of a threshold is 70 bits per 2K bytes.

In some embodiments, only one page (e.g., the middle page) or a subset of pages are used to test for broken word lines.

On example test sequence: Test: 1) WL0 of Block 0, 2) WL0 of Block 1, . . . , N) WL0 of last block in plane, N+1) WL1 of Block 0, N+2) WL1 of Block 1, . . . , 2N) WL1 of last block in plane, and so forth all the way to WL85 of last block in the plane. This gives each block plenty of time for WLs at VREAD to come down to zero before the block is revisited.

The system can also use a sequential read process on an exception basis whenever errors on one page are high enough for ECC engine not to be able to converge (even if there is not a broken word line). It has been found that the sequential read processes can reduce errors on non-broken word lines. When ECC does not converge, the system can invoke a sequential read process before it attempts a dynamic read process. In systems, that do CVD tracking (dynamically determining threshold voltage distributions and/or read compare levels) in the background, a sequential read process can be invoked using the pre-acquired read levels suitable for the page at hand, again on exception basis when ECC does not converge.

One embodiment includes reading data from non-volatile storage elements a page at a time; determining the existence of one or more errors in the data read; and in response to determining the one or more errors, recovering the data from the non-volatile storage elements using a sequential read processes.

One embodiment includes a non-volatile storage system, comprising: a plurality of non-volatile storage elements; and one or more managing circuits in communication with the non-volatile storage elements. The one or more managing circuits read data from the plurality of non-volatile storage elements a page at a time and determine the existence of one or more errors in the data read. The one or managing circuits recover the data from the non-volatile storage elements using a sequential read processes in response to determining the one or more errors.

One embodiment includes reading non-volatile storage elements using a page-by-page read process; determining the existence of one or more errors; and in response to determining the one or more errors, recovering data from the non-volatile storage elements using one or more sequential read processes.

One embodiment includes reading non-volatile storage elements using a page-by-page read process; reading the non-volatile storage elements using a sequential read process; comparing results of the two read processes; and determining that a fault exists if result of the page-by-page read process and the sequential read process differ by a threshold.

In various alternatives, the reading non-volatile storage elements using the page-by-page read process includes reading only one page of data at a time; the reading non-volatile storage elements using the page-by-page read process includes reading a page of data at a time the non-volatile storage elements are connected to a common word line and each of the non-volatile storage elements store multiple bits of data with each bit of data for a non-volatile storage element in a different page; the sequential read process comprises reading all bits of data stored in the non-volatile storage elements; the non-volatile storage elements store data in a set of data states associated with threshold voltages, read compare levels between neighboring data states are used to sense data, reading data from non-volatile storage elements using the page-by-page read process comprises performing sensing operations at only a subset of the read compare levels when sensing data for a particular page and the sequential read process comprises performing sensing operations at all of the read compare levels for the non-volatile storage elements; the determining that a fault exists comprises comparing a result of the page-by-page read process with a result of the sequential read process on a bit by bit basis; the determining that a fault exists comprises determining that the fault exists if a number of bits of the page-by-page read process that differ from the sequential read process is greater than a threshold; the determining that a fault exists comprises XNORing a result of the page-by-page read process with a result of the sequential read process on a bit by bit basis; the non-volatile storage elements are in a common block and the method further comprises removing the common block from use in response to determining that a fault exists; the non-volatile storage elements are in a common block and the method further comprises marking the common block as having an error in response to determining that a fault exists.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:

1. A method for reading non-volatile storage, comprising:
   reading data from non-volatile storage elements a page at a time;
   determining the existence of one or more errors in the data read; and
   in response to determining the one or more errors, recovering the data from the non-volatile storage elements using a sequential read processes, the sequential read process includes performing sensing operations at read compare levels between all data states for the non-volatile storage elements.

2. The method of claim 1, wherein:
   reading data from non-volatile storage elements a page at a time comprises performing a page-by-page read process that reads only one page of data at a time.

3. The method of claim 1, wherein:
   the non-volatile storage elements are connected to a common word line; and
   each of the non-volatile storage elements store multiple bits of data with each bit of data for a non-volatile storage element in a different page.

4. The method of claim 1, wherein the determining the existence of one or more errors comprises:
   using an error correction code to determine that an error exists.

5. The method of claim 4, wherein the determining the existence of one or more errors further comprises:
   determining that one or more errors are not correctable using the error correction code.

6. The method of claim 1, wherein the sequential read process comprises:
   reading all bits of data stored in the non-volatile storage elements.

7. The method of claim 1, wherein reading data from non-volatile storage elements a page at a time comprises:
   reading data from the non-volatile storage elements for a first page;
   reading data from the non-volatile storage elements for a second page after reading data from the non-volatile storage elements for the first page; and
   reading data from the non-volatile storage elements for a third page after reading data from the non-volatile storage elements for the second page.

8. A method for reading non-volatile storage, comprising:
   reading data from non-volatile storage elements a page at a time, the non-volatile storage elements store data in a set of data states associated with threshold voltages, read compare levels between neighboring data states are used to sense data, reading data from non-volatile storage elements a page at a time comprises performing sensing operations at only a subset of the read compare levels when sensing data for a particular page;
   determining the existence of one or more errors in the data read; and
   in response to determining the one or more errors, recovering the data from the non-volatile storage elements using a sequential read processes, the sequential read process comprises performing sensing operations at read compare levels between all data states for the non-volatile storage elements.

9. A non-volatile storage system, comprising:
   a plurality of non-volatile storage elements, the non-volatile storage elements store data in a set of data states associated with threshold voltages, a set of read compare levels between neighboring data states are used to sense data; and
   one or more managing circuits in communication with the non-volatile storage elements, the one or more managing circuits are configured to read data from the plurality of non-volatile storage elements a page at a time and determine the existence of one or more errors in the data read, the one or managing circuits are configured to recover the data from the non-volatile storage elements using a sequential read processes in response to determining the one or more errors, the one or more managing circuits are configured to read data from non-volatile storage elements a page at a time by performing sensing operations at only a subset of the set of read compare levels when sensing data for a particular page, the sequential read process comprises the one or more managing circuits performing sensing operations at all of the read compare levels of the set for the non-volatile storage elements.

10. The non-volatile storage system of claim 9, wherein:
    the one or more managing circuits are configured to read data from non-volatile storage elements a page at a time by performing a page-by-page read process that reads only one page of data at a time.

11. The non-volatile storage system of claim 9, further comprising:
    a common word line, the non-volatile storage elements are connected to a common word line, each of the non-volatile storage elements store multiple bits of data with each bit of data in a different page.

12. The non-volatile storage system of claim 9, wherein:
    the one or more managing circuits are configured to determine the existence of one or more errors by using an error correction code to determine that an error exists and determine that one or more errors are not correctable using the error correction code.

13. The non-volatile storage system of claim 9, wherein:
    the one or more managing circuits are configured to perform the sequential read process by reading all bits of data stored in the non-volatile storage elements.

14. A method for reading non-volatile storage, comprising:
    reading non-volatile storage elements using a page-by-page read process, the non-volatile storage elements store data in a set of data states associated with threshold voltages, read compare levels between neighboring data states are used to sense data, reading non-volatile storage elements using the page-by-page read process comprises performing sensing operations at only a subset of the read compare levels when sensing data for a particular page;
    determining the existence of one or more errors; and
    in response to determining the one or more errors, recovering data from the non-volatile storage elements using one or more sequential read processes, the sequential read process comprises performing sensing operations at all of the read compare levels for the non-volatile storage elements.

15. A method for testing for a fault, comprising:
    reading non-volatile storage elements using a page-by-page read process;

reading the non-volatile storage elements using a sequential read process;
comparing results of the page-by-page read process and the sequential read process; and
determining that a fault exists if results of the page-by-page read process and the sequential read process differ by a threshold.

16. The method of claim 15, wherein:
the reading non-volatile storage elements using the page-by-page read process includes reading only one page of data at a time.

17. The method of claim 15, wherein:
the reading non-volatile storage elements using the page-by-page read process includes reading a page of data at a time.

18. The method of claim 17, wherein:
the non-volatile storage elements are connected to a common word line; and
each of the non-volatile storage elements store multiple bits of data with each bit of data for a non-volatile storage element in a different page.

19. The method of claim 15, wherein the sequential read process comprises
reading all bits of data stored in the non-volatile storage elements.

20. The method of claim 15, wherein:
the non-volatile storage elements store data in a set of data states associated with threshold voltages;
read compare levels between neighboring data states are used to sense data;
reading data from non-volatile storage elements using the page-by-page read process comprises performing sensing operations at only a subset of the read compare levels when sensing data for a particular page; and
the sequential read process comprises performing sensing operations at all of the read compare levels for the non-volatile storage elements.

21. The method of claim 15, wherein the determining that a fault exists comprises:
comparing a result of the page-by-page read process with a result of the sequential read process on a bit by bit basis.

22. The method of claim 21, wherein the determining that a fault exists comprises:
determining that the fault exists if a number of bits of the page-by-page read process that differ from the sequential read process is greater than a threshold.

23. The method of claim 15, wherein the determining that a fault exists comprises:
XNORing a result of the page-by-page read process with a result of the sequential read process on a bit by bit basis.

24. The method of claim 15, wherein the non-volatile storage elements are in a common block, the method further comprising:
removing the common block from use in response to determining that a fault exists.

25. The method of claim 15, wherein the non-volatile storage elements are in a common block, the method further comprising:
marking the common block as having an error in response to determining that a fault exists.

* * * * *